US008263992B2

(12) United States Patent
Chen et al.

(10) Patent No.: US 8,263,992 B2
(45) Date of Patent: Sep. 11, 2012

(54) LIGHT EMITTING UNIT

(75) Inventors: Kuo-Tso Chen, Taipei (TW); Tony K. T. Chen, Taoyuan County (TW)

(73) Assignee: Gio Optoelectronics Corp., Tainan County (TW)

( * ) Notice: Subject to any disclaimer, the term of this patent is extended or adjusted under 35 U.S.C. 154(b) by 398 days.

(21) Appl. No.: 12/608,051

(22) Filed: Oct. 29, 2009

(65) Prior Publication Data

US 2010/0109036 A1    May 6, 2010

(30) Foreign Application Priority Data

Oct. 30, 2008    (TW) ............................... 97141837 A

(51) Int. Cl.
*H01L 33/00* (2010.01)

(52) U.S. Cl. .................................. 257/98; 257/E33.072

(58) Field of Classification Search .................... 257/98, 257/E33.072; 362/298
See application file for complete search history.

(56) References Cited

U.S. PATENT DOCUMENTS

| | | | |
|---|---|---|---|
| 6,404,131 B1 | 6/2002 | Kawano et al. | |
| 7,279,719 B2 * | 10/2007 | Suehiro et al. | .................. 257/98 |
| 2007/0023774 A1 | 2/2007 | Wirth et al. | |
| 2008/0137335 A1 | 6/2008 | Tsai et al. | |
| 2008/0210968 A1 | 9/2008 | Ishihara | |

* cited by examiner

*Primary Examiner* — Mark Prenty
(74) *Attorney, Agent, or Firm* — Birch, Stewart, Kolasch & Birch, LLP

(57) ABSTRACT

A light emitting unit includes a substrate, a first reflecting element, a light-emitting diode (LED), and a second reflecting element. At least one part of the substrate is light permeable. The LED is disposed between the substrate and the first reflecting element, and the first and second reflecting elements are disposed on two opposite sides of the substrate, respectively.

23 Claims, 5 Drawing Sheets

LIGHT EMITTING UNIT

CROSS REFERENCE TO RELATED APPLICATIONS

This Non-provisional application claims priority under 35 U.S.C. §119(a) on Patent Application No(s). 097141837 filed in Taiwan, Republic of China on Oct. 30, 2008, the entire contents of which are hereby incorporated by reference.

BACKGROUND OF THE INVENTION

1. Field of Invention

The present invention relates to a light emitting unit.

2. Related Art

Since the light-emitting diode (LED) has the advantages of good brightness and power consumption, the application fields of the LED have been broadened accompanying with the technology development of the LED. For example, the LED can be used in an illumination apparatus or the backlight of a liquid crystal display (LCD) device.

As shown in FIG. 1, a conventional light emitting unit 1 includes a circuit substrate 11 and a LED 12, which is disposed on the circuit substrate 11. The LED 12 is electrically connected with the circuit layer (not shown) on the circuit substrate 11 by wire bonding.

The light-emitting layer of the LED 12 can emit light toward all directions. However, the conventional circuit substrate 11, such as a printed circuit board, is opaque, so that the light emitted towards the rear of the LED 12 can not pass through the circuit substrate 11 and then be outputted. This also results in the limitation of the utilization of the light emitted from the LED 12. In addition, the light emitted form the LED 12 is uniformly towards all directions, so that the light emitting unit 1 can not output the light with proper directional property.

Therefore, it is an important subjective of the present invention to provide a light emitting unit that has proper directional property, can be manufactured in mass production, and is capable of increasing the utilization of the light emitted from the LED.

SUMMARY OF THE INVENTION

In view of the foregoing, the present invention is to provide a light emitting unit that has good directional property and can be manufactured in mass production and increase the utilization of the light emitted from the LED.

To achieve the above, the present invention discloses a light emitting unit including a substrate, a first reflecting element, a light-emitting diode (LED), and a second reflecting element. At least one part of the substrate is light permeable. The LED is disposed between the substrate and the first reflecting element, and the first and second reflecting elements are disposed on two opposite sides of the substrate, respectively.

In addition, the present invention also discloses a light emitting unit including a substrate, a reflecting element, a LED, and a lens element. At least one part of the substrate is light permeable. The LED is disposed between the substrate and the reflecting element, and the lens element is located opposite to the reflecting element and is disposed on a light outputting surface of the substrate.

To achieve the above, the present invention further discloses a light emitting unit including a substrate, a reflecting element, and a LED. At least one part of the substrate is light permeable, and the LED is disposed between the substrate and the reflecting element. In this case, a maximum diameter of the reflecting element is smaller than five times of a maximum side of the LED.

As mentioned above, the light emitting unit of the present invention has the LED disposed between the substrate and a reflecting element, and at least one part of the substrate is light permeable. Consequently, the reflecting element with small diameter can reflect the light emitted from the surface of the LED, and the reflected light can pass through the substrate. The reflecting element with small diameter can also concentrate the light passing through the substrate within a smaller diameter, which is advantageous for the following light reflecting or focusing design. The light emitted from the rear side of the LED may pass through the substrate and then be outputted to outside, so that the light utilization of the LED can be increased. Moreover, the lens element or another reflecting element is disposed on the other side of the substrate for controlling the traveling direction of the light that passes through the substrate. This feature can improve the directional property of the light emitted from the light emitting unit. In addition, the configuration of the lens element or another reflecting element, which is disposed on the other side of the substrate, can make the light emitting unit to be a transmissive type or a reflective type device, so that the application fields of the light emitting unit of the present invention can be broadened.

In addition, the light emitting unit of the present invention may have a plurality of reflecting elements and LEDs that are disposed on different surfaces of a single substrate. This configuration allows the reflecting elements and LEDs to be installed on, manufactured with, and/or inspected with the same substrate, so that the light emitting unit of the present invention can be easily manufactured in mass production.

BRIEF DESCRIPTION OF THE DRAWINGS

The invention will become more fully understood from the detailed description and accompanying drawings, which are given for illustration only, and thus are not limitative of the present invention, and wherein.

DETAILED DESCRIPTION OF THE INVENTION

The present invention will be apparent from the following detailed description, which proceeds with reference to the accompanying drawings, wherein the same references relate to the same elements.

First Embodiment

Figure 1:
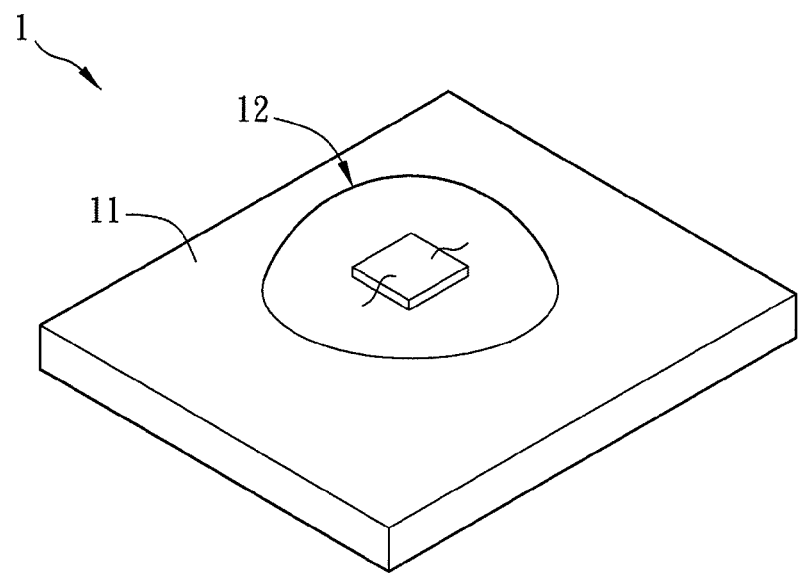
FIG. 1 is a schematic diagram of a conventional light emitting unit.
Figure 2A:
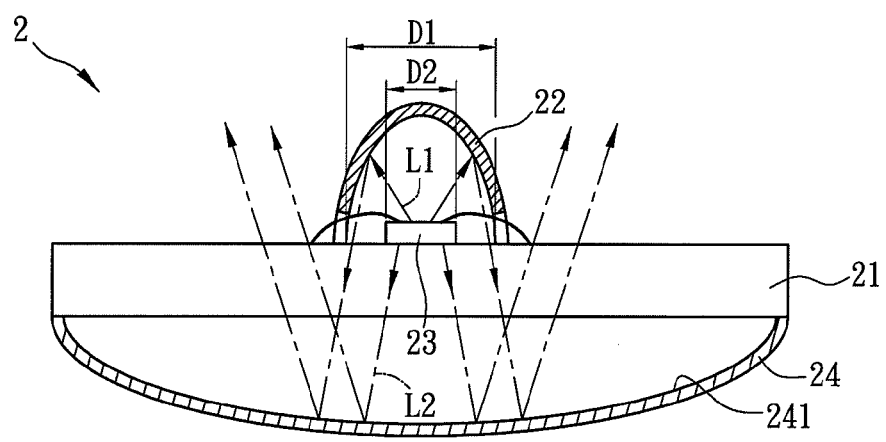
FIG. 2A is a schematic diagram of a light emitting unit according to a first embodiment of the present invention.

With reference to FIG. 2A, a light emitting unit 2 according to a first embodiment of the present invention includes a substrate 21, a first reflecting element 22, a light-emitting diode (LED) 23, and a second reflecting element 24.

At least one part of the substrate 21 is light permeable, and the material of the substrate 21 may include glass, sapphire, quartz, a polymer material, or a plastic material. In addition, the substrate 21 can be a circuit substrate (e.g. a glass circuit board).

The first reflecting element 22 is, for example, a reflective plate or a reflective cup, and the material thereof can be metal, metal oxide, or white coating. If the first reflecting element 22 is a reflective cap, the section thereof can be a planar surface or a curve surface. In this embodiment, the first reflecting element 22 is a reflective cap with curved surface, and the curved surface may have one or more focuses. The maximum diameter D1 of the first reflecting element 22 is smaller than five times of the length D2 of the maximum side of the LED 23. In practice, the maximum diameter D1 of the first reflecting element 22 is preferably smaller than twice of the length D2 of the maximum side of the LED 23. To be noted, the diameter of the first reflecting element 22 represents the efficient optical diameter of the first reflecting element 22 itself or its opening. If the shape of the first reflecting element 22 itself or its opening is irregular, the maximum diameter D1 represents the efficient optical diameter of the first reflecting element 22 itself or its opening.

The LED 23 is disposed between the substrate 21 and the first reflecting element 22, and it can be a LED package or a LED die. In this embodiment, the LED 23 is, for example but not limited to, a LED die. The spectrum of the light emitted by the LED 23 is distributed within the visible light range or the UV light range for example. If the spectrum of the LED 23 is distributed within the visible light range, the LED 23 can be a red light LED, a green light LED, a blue light LED, or any LED capable of emitting visible light. In this embodiment, the LED 23 is connected with the circuit layer (not shown) of the substrate 21 by wire bonding. Since the diameter of the first reflecting element 22 is smaller, the leads of the LED 23 may extend out of the first reflecting element 22 for electrically connecting with the circuit layer of the substrate 21.

Figure 2B:
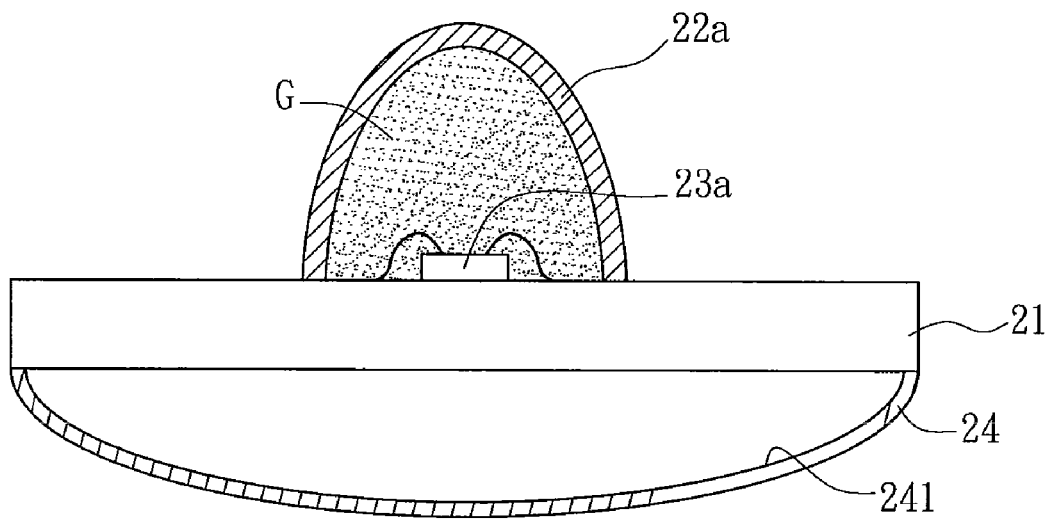
FIGS. 2B and 2C are schematic diagrams of different light emitting units according to the first embodiment of the present invention.
Figure 2C:
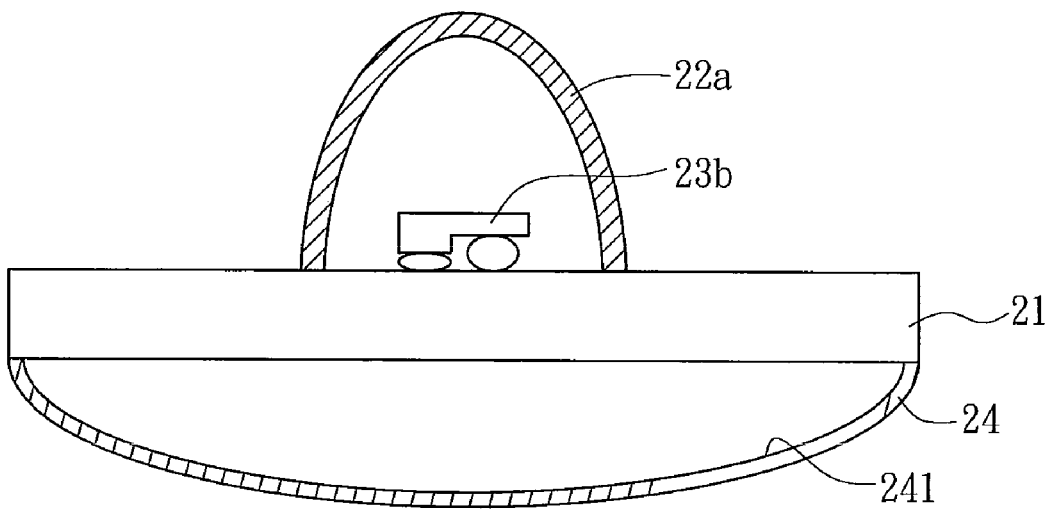

Alternatively, as shown in FIG. 2B, the diameter of the first reflecting element 22a may be slightly larger, so that the leads of the LED 23a can be remained inside the first reflecting element 22a and electrically connected to the external driving power source through the circuit layer of the substrate 21. In this case, a fluid or a gel G is filled between the substrate 21 and the first reflecting element 22a. For example, the gel G can be a melted, semisolid, plastic or solid gel, and the fluid can be gas (e.g. air or inert gas) or liquid (e.g. oil or solvent). Consequently, the heat dissipation can be improved according to the thermal convection of the fluid or gel. In addition, as shown in FIG. 2C, the LED 23b may be connected with the circuit layer (not shown) of the substrate 21 by flip-chip connection.

With reference to FIG. 2A again, the first reflecting element 22 and the second reflecting element 24 are disposed on opposite sides of the substrate 21, respectively. In other words, the first reflecting element 22 and the second reflecting element 24 are disposed on opposite surfaces of the substrate 21, respectively. The second reflecting element 24 is, for example, a reflective layer, a reflective plate or a reflective cap. The reflectively layer or the reflective plate may be flatly disposed on the bottom surface of the substrate 21. In this embodiment, the second reflecting element 24 is a reflective cap with an arc-shape section, and the size of the second reflecting element 24 is larger than that of the first reflecting element 22. To be noted, the sizes of the first and second reflecting elements 22 and 24 are described by the diameter of their openings.

Accordingly, at least one part of the light L1 emitted from the top surface of the LED 23 is reflected by the first reflecting element 22 and then passes through the substrate 21, and the light L2 emitted from the bottom surface of the LED 23 directly passes through the substrate 21. Then, the light L1 and the light L2 are reflected by the second reflecting element 24 and then pass through the substrate 21. In other words, at least one part of the light L1 and the light L2 is sequentially reflected by the first reflecting element 22 and the second reflecting element 24, and then passes through substrate 21.

As mentioned above, the light emitted from both the top and bottom surfaces of the LED 23 can be outputted, so that the light utilization of the light emitting unit 2 can be increased. In addition, the curvature or shape of the reflective surface 241 of the second reflecting element 24 may have various designs, e.g. a paraboloid, hemisphere or ellipsoid surface, for controlling the outputting directions of the light L1 and the light L2 outputted from the light emitting unit 2. For example, the outputted light L1 and L2 may form parallel light or non-parallel light, and be perpendicular or non-perpendicular to the light outputting surface, thereby increasing the directional property of the light emitting unit 2.

Figure 3A:
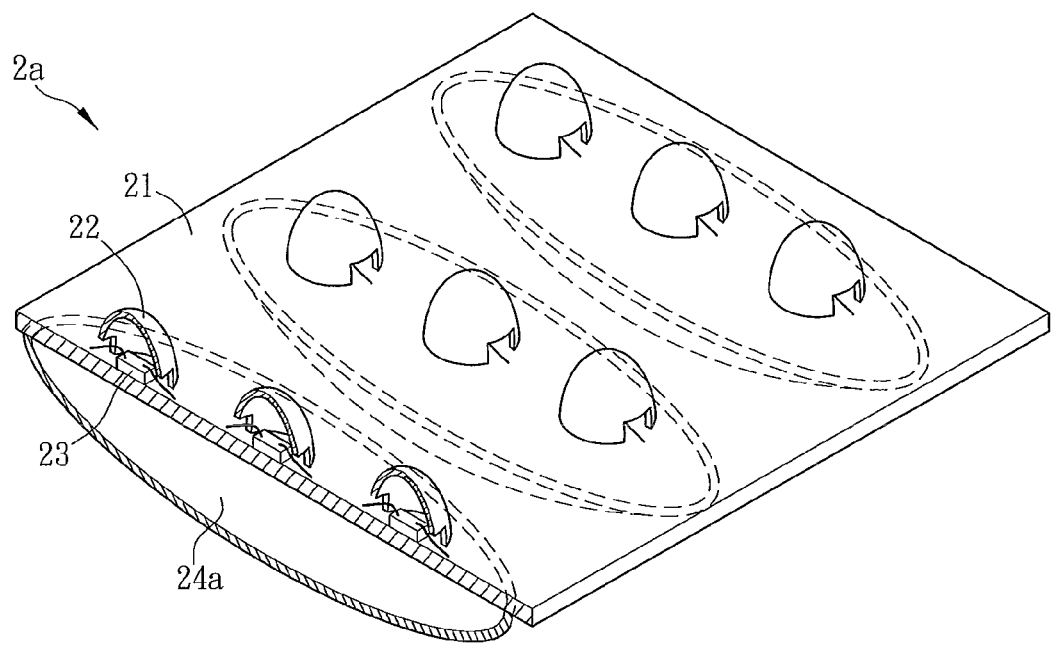
FIGS. 3A to 3E are schematic diagrams of different aspects of the light emitting unit according to the first embodiment of the present invention.

FIG. 3A is a schematic diagram of a light emitting unit 2a, which is another aspect according to the first embodiment of the present invention. To make the following illumination more comprehensive, FIG. 3A shows the cross sections of some of the LEDs 23, the first reflecting elements 22 and the second reflecting elements 24a. As shown in FIG. 3A, the light emitting unit 2a includes a plurality of first reflecting elements 22, a plurality of LEDs 23, and a plurality of second reflecting elements 24a. The first reflecting elements 22 are disposed corresponding to the LEDs 23, respectively, and each second reflecting element 24a may correspond to one or more LEDs 23. In this case, each second reflecting element 24a is disposed corresponding to several LEDs 23. For example, the first reflecting elements 22 and the LEDs 23 are arranged in a two-dimensional array. Of course, they can also be arranged in a one-dimensional array.

The second reflecting elements 24a are disposed corresponding to the LEDs 23, which are arranged in a two-dimensional array. Accordingly, the outputting directions of the light emitted from the LEDs 23 can be controlled by the various designs of the curvature or shape of the reflective surfaces of the second reflecting elements 24a, thereby increasing the directional property of the light emitting unit 2a. To be noted, the second reflecting elements 24a can be replaced by a reflective plate or layer so as to decrease the complication of the manufacturing process.

Figure 3B:
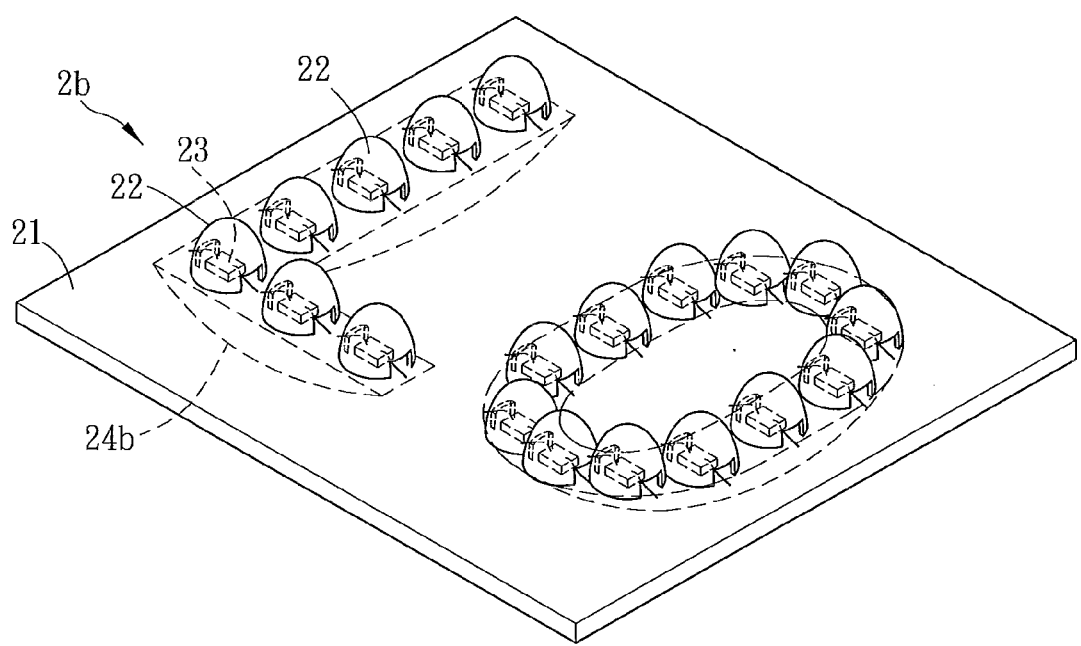

FIG. 3B is a schematic diagram of a light emitting unit 2b, which is another aspect according to the first embodiment of the present invention. As shown in FIG. 3B, the first reflecting elements 22 and the LEDs 23 of the light emitting unit 2b are arranged according to a specific pattern such as a letters pattern or a geometric pattern, and each specific pattern is corresponding to a second reflecting element 24b for controlling the outputting directions of the light emitted from the LEDs 23. Accordingly, the application fields of the light emitting unit 2b can be broadened. For example, it can be applied to the media boards or traffic lights.

Figure 3C:
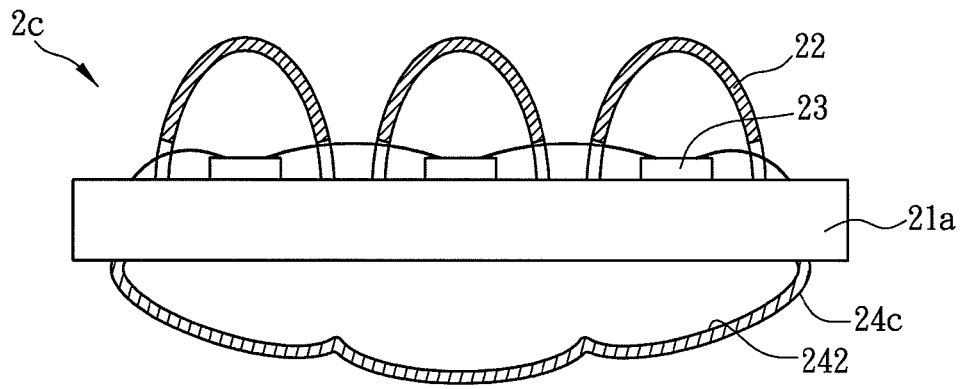

FIG. 3C is a schematic diagram of a light emitting unit 2c, which is another aspect according to the first embodiment of the present invention. As shown in FIG. 3C, the LEDs 23 of the light emitting unit 2c are electrically connected by die-to-die wire bonding directly, so that they can be electrically connected with each other through the wires. Thus, the layout of the circuit layer on the substrate 21a can be simplified, and the cost for the wires can be reduced. Moreover, the substrate 21a may not have the circuit layer, and the light emitting unit 2c is electrically connected with another circuit board directly. This can further decrease the total cost of the light emitting unit 2c and enhance the manufacturing efficiency thereof. In addition, the second reflecting element 24c may include a plurality of reflective structures 242, which are disposed corresponding to the LEDs 23, respectively. Besides, the reflective structures 242 may have different curvatures or shapes.

Referring to FIGS. 3A to 3C, in each of the light emitting units 2a, 2b and 2c, the first reflecting elements 22, LEDs 23 and second reflecting elements 24a, 24b or 24c may be disposed on different surfaces of a single substrate 21 or 21a. In this case, the first reflecting elements 22, LEDs 23 and second reflecting elements 24a, 24b or 24c can be installed on, manufactured with, and/or inspected with the same substrate 21 or 21a, so that the light emitting unit 2a, 2b or 2c can be easily manufactured in mass production.

Figure 3D:
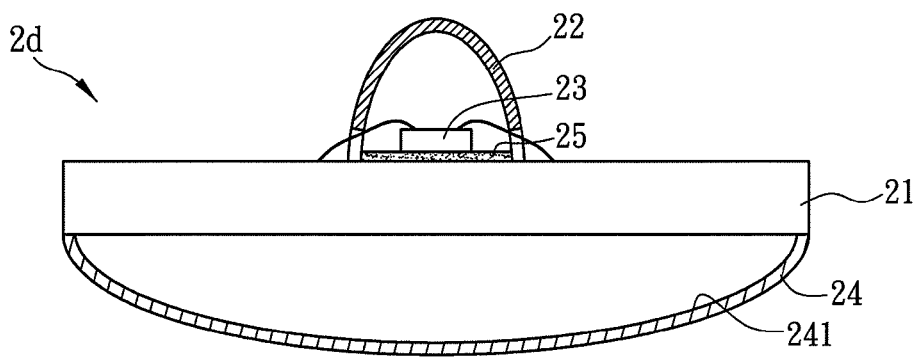

FIG. 3D is a schematic diagram of a light emitting unit 2d, which is another aspect according to the first embodiment of the present invention. As shown in FIG. 3D, the light emitting unit 2d further includes a fluorescent conversion material 25 disposed between the LED 23 and the substrate 21 and located corresponding to the opening of the first reflecting element 22. The distribution area of the fluorescent conversion material 25 is larger than or equal to the area of the opening of the first reflecting element 22. In this embodiment, the distribution area of the fluorescent conversion material 25 is, for example but not limited to, equal to the area of the opening of the first reflecting element 22.

The fluorescent conversion material 25 at least includes a yellow fluorescent conversion material, a red fluorescent conversion material, a green fluorescent conversion material, a blue fluorescent conversion material, or their combinations. For example, the fluorescent conversion material 25 can be a fluorescent conversion layer or a phosphor tape. In this embodiment, the fluorescent conversion material 25 is, for example but not limited to, a fluorescent conversion layer. Alternatively, the fluorescent conversion material 25 can also be disposed at any place on the light traveling route other than the above-mentioned location between the LED 23 and the substrate 21. For example, the fluorescent conversion material 25 can be disposed on the top and/or bottom surfaces of the substrate 21, or on the inner surface of the first reflecting element 22 and/or the second reflecting element 24, or be doped in the filling material between the first reflecting element 22 and the substrate 21a (e.g. the fluid or gel G of FIG. 2B), or in the molding gel disposed between the LED 23 and the substrate 21.

The light emitted from the LED 23 can excite the fluorescent conversion material 25 in advance and then be outputted out of the light emitting unit 2d. Consequently, the fluorescent conversion material 25 can alter the color of the light outputted from the light emitting unit 2d, thereby broadening the application fields of the light emitting unit 2d. In practice, after the fluorescent conversion material 25 is disposed on the substrate 21, a standard light source is used to irradiate the fluorescent conversion material 25 to detect the spectrum or color temperature of the outputted light. If the fluorescent conversion material 25 can pass the inspection, the LED 23 is then disposed on the fluorescent conversion material 25. Accordingly, the reliability of the light emitting unit 2d can be maintained. Alternatively, if the fluorescent conversion material 25 is substituted by a phosphor tape, the entire manufacturing process of the light emitting unit 2d can be further simplified.

Figure 3E:
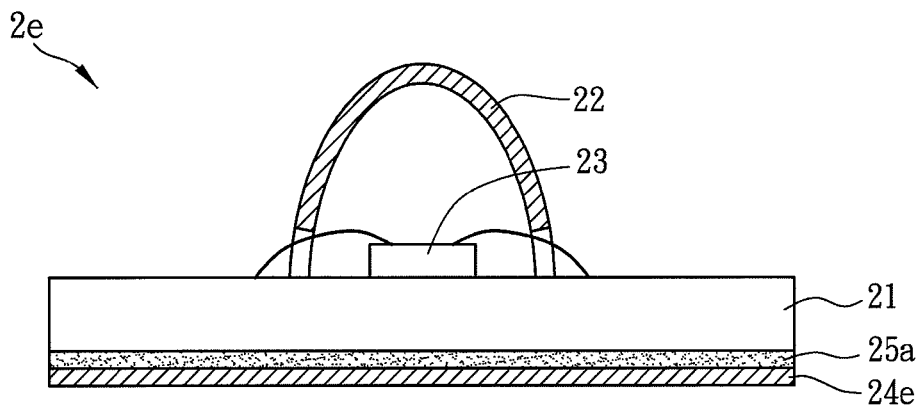

FIG. 3E is a schematic diagram of a light emitting unit 2e, which is another aspect according to the first embodiment of the present invention. As shown in FIG. 3E, the second reflecting element 24e is, for example, a reflective layer, the fluorescent conversion material 25a is disposed between the second reflecting element 24e and the substrate 21, and the second reflecting element 24e and the fluorescent conversion material 25a are both located on the bottom surface of the substrate 21. The distribution area of the fluorescent conversion material 25a is larger than or equal to the area of the opening of the first reflecting element 22. In this embodiment, the distribution area of the fluorescent conversion material 25a is, for example but not limited to, larger than the area of the opening of the first reflecting element 22. Since the second reflecting element 24e is a reflective layer, and the fluorescent conversion material 25a is disposed between the second reflecting element 24e and the substrate 21, the fluorescent conversion material 25a is not too close to the LED 23 so as to prevent the deterioration of the fluorescent conversion material 25a caused by the bright light and high temperature of the LED 23. Otherwise, if there are a plurality of LEDs 23 disposed on the substrate 21, the second reflecting element 24e and the fluorescent conversion material 25a as well as the LEDs 23 can be disposed on a plurality of areas on the bottom surface of the substrate 21.

Second Embodiment

Figure 4:
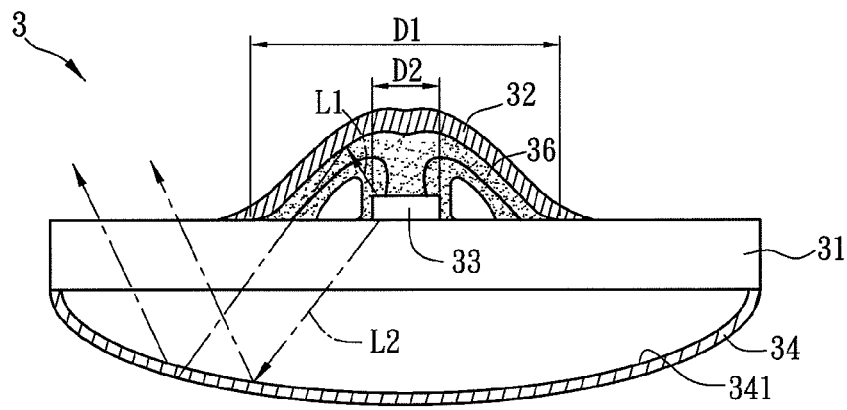
FIG. 4 is a schematic diagram of a light emitting unit according to a second embodiment of the present invention.

FIG. 4 is a schematic diagram of a light emitting unit 3 according to a second embodiment of the present invention. With reference to FIG. 4, the light emitting unit 3 includes a substrate 31, a first reflecting element 32, a LED 33, a second reflecting element 34, and a molding body or an insulation layer 36. In this embodiment, the features and functions of the substrate 31, the LED 33 and the second reflecting element 34 are the same as those of the substrate 21, the LED 23 and the second reflecting element 24 of the first embodiment, so the detailed descriptions thereof will be omitted.

The molding body or insulation layer 36 at least partially covers the LED 33 and is at least partially disposed between the first reflecting element 32 and the LED 33. In this embodiment, the first reflecting element 32 is a reflective layer that is formed on the molding body or insulation layer 36.

If the first reflecting element 32 is made of metal, it can be formed by evaporation or sputtering; otherwise, if the first reflecting element 32 is made of reflective coating, it can be formed by gluing, ink-jet printing or printing. Since the manufacturing processes are different, the shape of the first reflecting element 32 may be various. In this case, when the first reflecting element 32 is a reflective layer, the maximum diameter D1 of the first reflecting element 32 roughly matches the opening formed by the inner surface of the reflective layer, which is smaller than five times of the length of the maximum side D2 of the LED 33. To be noted, the diameter of the reflecting element 32 represents the efficient optical diameter of the area covered by the opening of the first reflecting element 32.

If the shape of the opening of the first reflecting element 32 is irregular, the maximum diameter D1 represents the maximum efficient optical diameter of the opening of the first reflecting element 32. The size of the second reflecting element 34 is greater than that of the first reflecting element 32. To be noted, the sizes of the first and second reflecting elements 32 and 34 are described by the covering area of the first reflecting element 32 and the diameter of the opening of the second reflecting element 34, respectively.

The material of the molding body or insulation layer 36 is light permeable, and it can be formed by gluing process. The configuration of the molding body or insulation layer 36 can not only prevent the direct contact of the first reflecting element 32 and the LED 33, which may result in that the light L1 emitted from the surface of the LED 33 can not reach the outside, but also avoid the short circuit caused by the contact of the LED 33 and the first reflecting element 32, which may be made of metal.

Alternatively, the molding body or insulation layer 36 can be made of a dielectric material or epoxy resin, and the structure thereof can be a single-layer refraction material structure or a multi-layer refraction material structure. In more detailed, the multi-layer refraction material structure may include several layers with different refraction indexes, and the layers arranged from close to the LED 33 to away from it have different refraction indexes from large to small in order. Accordingly, the light outputting efficiency of the LED 33 can be increased depending on the property of the molding body with the multi-layer refraction material structure.

Similarly, the light L1 emitted from the top surface of the LED 33 is reflected by the first reflecting element 32 and then passes through the substrate 31, and the light L2 emitted from the bottom surface of the LED 33 directly passes through the substrate 31. Then, the light L1 and the light L2 are reflected by the reflective surface 341 of the second reflecting element 34 and then pass through the substrate 31.

To be noted, the first reflecting element 32 of the second embodiment may substitute the above-mentioned first reflecting element 22 of the first embodiment of FIGS. 3A to 3D. Since the features and functions of the different structures of the light emitting units are described in the previous embodiment, the detailed descriptions thereof will be omitted. In addition, if the first reflecting element 32 is used in the structure of FIG. 3D, the distribution area of the fluorescent conversion material 25 is larger than or equal to the covering area of the first reflecting element 32 of this embodiment, and the fluorescent conversion material 25 can be mixed in the molding body or insulation layer 36 of this embodiment.

Third Embodiment

Figure 5:
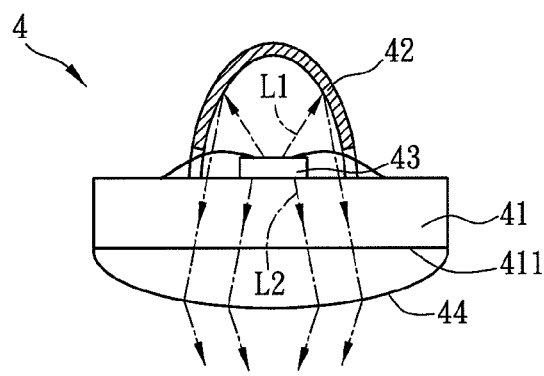
FIG. 5 is a schematic diagram of a light emitting unit according to a third embodiment of the present invention.

FIG. 5 is a schematic diagram of a light emitting unit 4 according to a third embodiment of the present invention. With reference to FIG. 5, the light emitting unit 4 includes a substrate 41, a reflecting element 42, a LED 43 and a lens element 44. In this embodiment, the features and functions of the substrate 41, the reflecting element 42 and the LED 43 are the same as those of the substrate 21, the first reflecting element 22 and the LED 23 of the first embodiment, so the detailed descriptions thereof will be omitted.

The lens element 44 is disposed opposite to the reflecting element 42 and is located on a light outputting surface 411 of the substrate 41. In other words, the reflecting element 42 and the lens element 44 are disposed on two opposite sides of the substrate 41, respectively. The lens element 44 may be a convex lens, microlens, or Fresnel lens, and the lens element 44 and the substrate 41 can be integrally formed. In this embodiment, the lens element 44 is a convex lens for example, and the lens element 44 is attached to the substrate 41.

At least a part of the light L1 emitted from the top surface of the LED 43 is reflected by the reflecting element 42 and then passes through the substrate 41 and the lens element 44, and the light L2 emitted from the bottom surface of the LED 43 directly passes through the substrate 41 and the lens element 44. In this case, the curvature or shape of the lens element 44 may have various designs for controlling the outputting directions of the light L1 and the light L2 outputted from the light emitting unit 4, thereby increasing the directional property of the light emitting unit 4.

Figure 6:
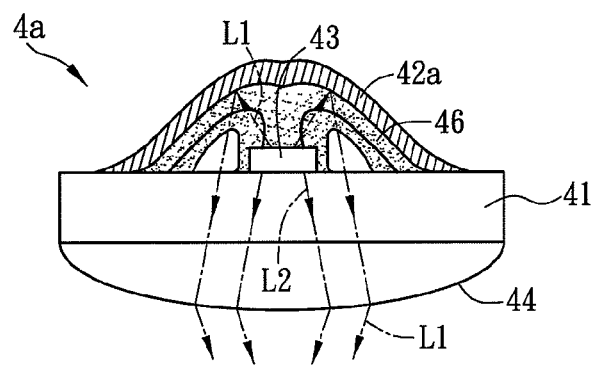
FIG. 6 is a schematic diagram of another light emitting unit according to the third embodiment of the present invention.

FIG. 6 is a schematic diagram of another light emitting unit 4a according to the third embodiment of the present invention. The light emitting unit 4a of FIG. 6 is different from the light emitting unit 4 of FIG. 5 in that the reflecting element 42a is a reflective layer, which is formed on an insulation layer 46. The features and functions of the reflecting element 42a and the insulation layer 46 are the same as those of the reflecting element 32 and insulation layer 36 of the previous embodiment, so the detailed descriptions thereof will be omitted.

Similarly, the light L1 emitted from the top surface of the LED 43 is reflected by the reflecting element 42a and then passes through the substrate 41 and the lens element 44, and the light L2 emitted from the bottom surface of the LED 43 directly passes through the substrate 41 and the lens element 44.

To be noted, each of the light emitting units 4 and 4a of this embodiment may have a plurality of LEDs 43, which can be arranged in one-dimensional array, two-dimensional array or a specific pattern as shown in FIGS. 3A and 3B, or can be electrically connected by die-to-die wire bonding directly as shown in FIG. 3C. In addition, the light emitting unit 4 or 4a may further include a fluorescent conversion material disposed between the LEDs 43 and the substrate 41 as shown in FIG. 3D. To be noted, if the light emitting unit 4 or 4a has the structure similar to that shown in FIG. 3D, the distribution area of the fluorescent conversion material must be larger than or equal to the covering area of the reflecting element 42a, and the fluorescent conversion material may be disposed in the molding body or insulation layer 46.

In summary, the light emitting unit of the present invention has the LED disposed between the substrate and a reflecting element, and at least one part of the substrate is light permeable. Consequently, the reflecting element with small diameter can reflect the light emitted from the surface of the LED, and the reflected light can pass through the substrate. The reflecting element with small diameter can also concentrate the light passing through the substrate within a smaller diameter, which is advantageous for the following light reflecting or focusing design. The light emitted from the rear side of the LED may pass through the substrate and then be outputted to outside, so that the light utilization of the LED can be increased. Moreover, the lens element or another reflecting element is disposed on the other side of the substrate for controlling the traveling direction of the light that passes through the substrate. This feature can improve the directional property of the light emitted from the light emitting unit. In addition, the configuration of the lens element or another reflecting element, which is disposed on the other side of the substrate, can make the light emitting unit to be a transmissive type or a reflective type device, so that the application fields of the light emitting unit of the present invention can be broadened.

In addition, the light emitting unit may have a plurality of LEDs, which are arranged in one-dimensional array, two-dimensional array or a specific pattern, so that the application fields thereof can be broadened. If the LEDs are connected by die-to-die wire bonding, the layout of the circuit layer on the substrate can be simplified. Moreover, the substrate may not have the circuit layer, and the light emitting unit is electrically connected with another circuit board directly. This can further decrease the total cost of the light emitting unit and enhance the manufacturing efficiency thereof.

Furthermore, the light emitting unit of the present invention may have a plurality of reflecting elements and LEDs that are disposed on different surfaces of a single substrate. This configuration allows the reflecting elements and LEDs to be installed on, manufactured with, and/or inspected with the same substrate, so that the light emitting unit of the present invention can be easily manufactured in mass production.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A light emitting unit, comprising:
    a substrate, wherein at least one part of the substrate is light permeable;
    a first reflecting element;
    a light-emitting diode (LED) disposed between the substrate and the first reflecting element; and
    a second reflecting element, wherein the first reflecting element and the second reflecting element are disposed on two opposite sides of the substrate, respectively.

2. The light emitting unit according to claim 1, wherein the size of the second reflecting element is larger than the size of the first reflecting element.

3. The light emitting unit according to claim 1, wherein at least one part of light emitted from the LED are reflected by the first reflectively element and the second reflecting element, and then passes through the substrate.

4. The light emitting unit according to claim 1, wherein a maximum diameter of the first element is smaller than five times of a maximum side of the LED.

5. The light emitting unit according to claim 1, wherein the first reflecting element is a reflective layer, a reflective plate or a reflective cup.

6. The light emitting unit according to claim 1, wherein the second reflecting element is a reflective layer, a reflective plate or a reflective cup.

7. The light emitting unit according to claim 1, wherein the material of the substrate comprises glass, sapphire, quartz, a polymer material, or a plastic material.

8. The light emitting unit according to claim 1, wherein the substrate is a circuit substrate.

9. The light emitting unit according to claim 1, wherein the LED is a LED package or a LED die.

10. The light emitting unit according to claim 1, further comprising:
    a molding body or an insulation layer at least partially covering the LED and at least partially disposed between the first reflecting element and the LED.

11. The light emitting unit according to claim 10, wherein the first reflecting element is a reflective layer and is formed on the molding body or the insulation layer.

12. The light emitting unit according to claim 10, further comprising:
    a fluorescent conversion material disposed inside the molding body or the insulation layer.

13. The light emitting unit according to claim 1, further comprising:
    a fluorescent conversion material disposed between the LED and the substrate.

14. The light emitting unit according to claim 1, further comprising:
    a fluorescent conversion material disposed between the substrate and the second reflecting element.

15. A light emitting unit, comprising:
    a substrate, wherein at least one part of the substrate is light permeable;
    a cup-shaped reflecting element having an opening; and
    a light-emitting diode (LED) disposed between the substrate and the cup-shaped reflecting element, and located among the opening;
    wherein a maximum diameter of the cup-shaped reflecting element is smaller than five times of a maximum side of the LED.

16. The light emitting unit according to claim 15, wherein the cup-shaped reflecting element is a reflective layer or a reflective cup.

17. The light emitting unit according to claim 15, further comprising:
    a molding body or an insulation layer at least partially covering the LED and at least partially disposed between the cup-shaped reflecting element and the LED.

18. The light emitting unit according to claim 17, wherein the cup-shaped reflecting element is a reflective layer and is formed on the molding body or the insulation layer.

19. The light emitting unit according to claim 17, further comprising:
    a fluorescent conversion material disposed inside the molding body or the insulation layer.

20. The light emitting unit according to claim 15, wherein the substrate is a circuit substrate.

21. The light emitting unit according to claim 15, wherein the LED is a LED package or a LED die.

22. The light emitting unit according to claim 15, further comprising:
    a fluorescent conversion material disposed between the LED and the substrate.

23. The light emitting unit according to claim 15, further comprising:
    a fluorescent conversion material disposed between the substrate and the cup-shaped reflecting element.

* * * * *